United States Patent
Sandhu et al.

(10) Patent No.: US 7,482,653 B2
(45) Date of Patent: Jan. 27, 2009

(54) NON-VOLATILE MEMORY WITH CARBON NANOTUBES

(75) Inventors: Gurtej S. Sandhu, Boise, ID (US); Chandra Mouli, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 209 days.

(21) Appl. No.: 11/185,320

(22) Filed: Jul. 20, 2005

(65) Prior Publication Data

US 2007/0018228 A1    Jan. 25, 2007

(51) Int. Cl.
*H01L 29/788* (2006.01)
*H01L 29/76* (2006.01)
*H01L 27/01* (2006.01)
*H01L 27/12* (2006.01)
*H01L 31/0392* (2006.01)

(52) U.S. Cl. .................. 257/315; 257/314; 257/350; 257/321

(58) Field of Classification Search ............... 257/315, 257/296, 316, 318, 321, 350, 314
See application file for complete search history.

(56) References Cited

U.S. PATENT DOCUMENTS

| | | | |
|---|---|---|---|
| 4,896,098 A | 1/1990 | Haritonidis et al. | |
| 6,858,521 B2 | 2/2005 | Jin | |
| 6,944,054 B2 | 9/2005 | Rueckes et al. | |
| 6,995,046 B2 | 2/2006 | Rueckes et al. | |
| 6,998,634 B2 | 2/2006 | Cheong et al. | |
| 7,262,991 B2 * | 8/2007 | Zhang et al. | 365/185.01 |
| 2004/0027889 A1 | 2/2004 | Occhipinti et al. | |
| 2004/0031975 A1 | 2/2004 | Kern et al. | |
| 2004/0160812 A1 | 8/2004 | Rinerson et al. | |
| 2005/0051805 A1 | 3/2005 | Kim et al. | |
| 2005/0174842 A1 | 8/2005 | Bertin et al. | |
| 2006/0011972 A1 * | 1/2006 | Graham et al. | 257/324 |

* cited by examiner

*Primary Examiner*—Chuong A. Luu
(74) *Attorney, Agent, or Firm*—Leffert Jay & Polglaze, P.A.

(57) ABSTRACT

Floating-gate memory cells having carbon nanotubes interposed between the substrate and the tunnel dielectric layer facilitate ballistic injection of charge into the floating gate. The carbon nanotubes may extend across the entire channel region or a portion of the channel region. For some embodiments, the carbon nanotubes may be concentrated near the source/drain regions. For some embodiments, the tunnel dielectric layer may adjoin the substrate in at least a portion of the channel region.

39 Claims, 14 Drawing Sheets

NON-VOLATILE MEMORY WITH CARBON NANOTUBES

TECHNICAL FIELD OF THE INVENTION

The present invention relates generally to semiconductor memory devices, and in particular, the present invention relates to floating-gate memory devices having carbon nanotubes.

BACKGROUND OF THE INVENTION

Memory devices are typically provided as internal storage areas in the computer. The term memory identifies data storage that comes in the form of integrated circuit chips. In general, memory devices contain an array of memory cells for storing data, and row and column decoder circuits coupled to the array of memory cells for accessing the array of memory cells in response to an external address.

One type of memory is a non-volatile memory known as Flash memory. A flash memory is a type of EEPROM (electrically-erasable programmable read-only memory) that can be erased and reprogrammed in blocks. Many modern personal computers (PCs) have their BIOS stored on a flash memory chip so that it can easily be updated if necessary. Such a BIOS is sometimes called a flash BIOS. Flash memory is also popular in wireless electronic devices because it enables the manufacturer to support new communication protocols as they become standardized and to provide the ability to remotely upgrade the device for enhanced features.

A typical flash memory comprises a memory array that includes a large number of memory cells arranged in row and column fashion. Each of the memory cells includes a floating-gate field-effect transistor capable of holding a charge. The cells are usually grouped into blocks. Each of the cells within a block can be electrically programmed in a random basis by charging the floating gate. The charge can be removed from the floating gate by a block erase operation. The data in a cell is determined by the presence or absence of the charge in the floating gate.

Flash memory typically utilizes one of two basic architectures known as NOR flash and NAND flash. The designation is derived from the logic used to read the devices. In NOR flash architecture, a column of memory cells are coupled in parallel with each memory cell coupled to a bit line. In NAND flash architecture, a column of memory cells are coupled in series with only the first memory cell of the column coupled to a bit line.

To meet demands for higher capacity memories, designers continue to strive for decreasing the size of individual memory cells and for reducing operating voltages.

For the reasons stated above, and for other reasons stated below which will become apparent to those skilled in the art upon reading and understanding the present specification, there is a need in the art for alternative memory device structures and methods of forming memory devices.

SUMMARY OF THE INVENTION

The above-mentioned problems with memory devices and other problems are addressed by the present invention and will be understood by reading and studying the following specification.

Floating-gate memory cells having carbon nanotubes interposed between the substrate and the tunnel dielectric layer facilitate ballistic injection of charge carriers into the floating gate of the memory cells. The carbon nanotubes may extend across the entire channel region or a portion of the channel region. For some embodiments, the carbon nanotubes may be concentrated near the source/drain regions. For some embodiments, the tunnel dielectric layer may adjoin the substrate in at least a portion of the channel region.

For one embodiment, the invention provides a floating-gate memory cell. The memory cell includes a tunnel dielectric layer overlying a semiconductor substrate, a floating-gate layer overlying the tunnel dielectric layer, an intergate dielectric layer overlying the floating-gate layer, a control gate layer overlying the intergate dielectric layer, carbon nanotubes extending from the semiconductor substrate to the tunnel dielectric layer and source/drain regions formed in the substrate and defining a channel region therebetween. The source/drain regions are adjacent the carbon nanotubes and the carbon nanotubes are overlying the channel region.

For another embodiment, the invention provides a floating-gate memory cell. The memory cell includes a plurality of carbon nanotubes overlying a semiconductor substrate, source/drain regions formed in the substrate adjacent the plurality of carbon nanotubes, a tunnel dielectric layer overlying the plurality of carbon nanotubes, a floating-gate layer overlying the tunnel dielectric layer, an intergate dielectric layer overlying the floating-gate layer and a control gate layer overlying the intergate dielectric layer.

For a further embodiment, the invention provides a method of forming a floating-gate memory cell. The method includes forming source/drain regions in a semiconductor substrate, wherein the source/drain regions define a channel region therebetween and forming a plurality of carbon nanotubes overlying at least a portion of the channel region. The method further includes forming a tunnel dielectric layer overlying the carbon nanotubes, forming a floating-gate layer overlying the tunnel dielectric layer, forming an intergate dielectric layer overlying the floating-gate layer and forming a control gate layer overlying the intergate dielectric layer.

For a still further embodiment, the invention provides a method of programming a floating-gate memory cell having carbon nanotubes interposed between a semiconductor substrate and a tunnel dielectric layer of the floating-gate memory cell. The method includes generating a field across the carbon nanotubes sufficient to ballistically inject charge carriers from the semiconductor substrate through the tunnel dielectric layer.

The invention still further provides methods and apparatus of varying scope.

DETAILED DESCRIPTION OF THE INVENTION

In the following detailed description of the present embodiments, reference is made to the accompanying drawings that form a part hereof, and in which is shown by way of illustration specific embodiments in which the inventions may be practiced. These embodiments are described in sufficient detail to enable those skilled in the art to practice the invention, and it is to be understood that other embodiments may be utilized and that process, electrical or mechanical changes may be made without departing from the scope of the present invention. The terms wafer and substrate used previously and in the following description include any base semiconductor structure. Both are to be understood as including silicon-on-sapphire (SOS) technology, silicon-on-insulator (SOI) technology, thin film transistor (TFT) technology, doped and undoped semiconductors, epitaxial layers of silicon supported by a base semiconductor, as well as other semiconductor structures well known to one skilled in the art. Furthermore, when reference is made to a wafer or substrate in the following description, previous process steps may have been utilized to form regions/junctions in the base semiconductor structure. The following detailed description is, therefore, not to be taken in a limiting sense, and the scope of the present invention is defined only by the appended claims and equivalents thereof.

Figure 1:
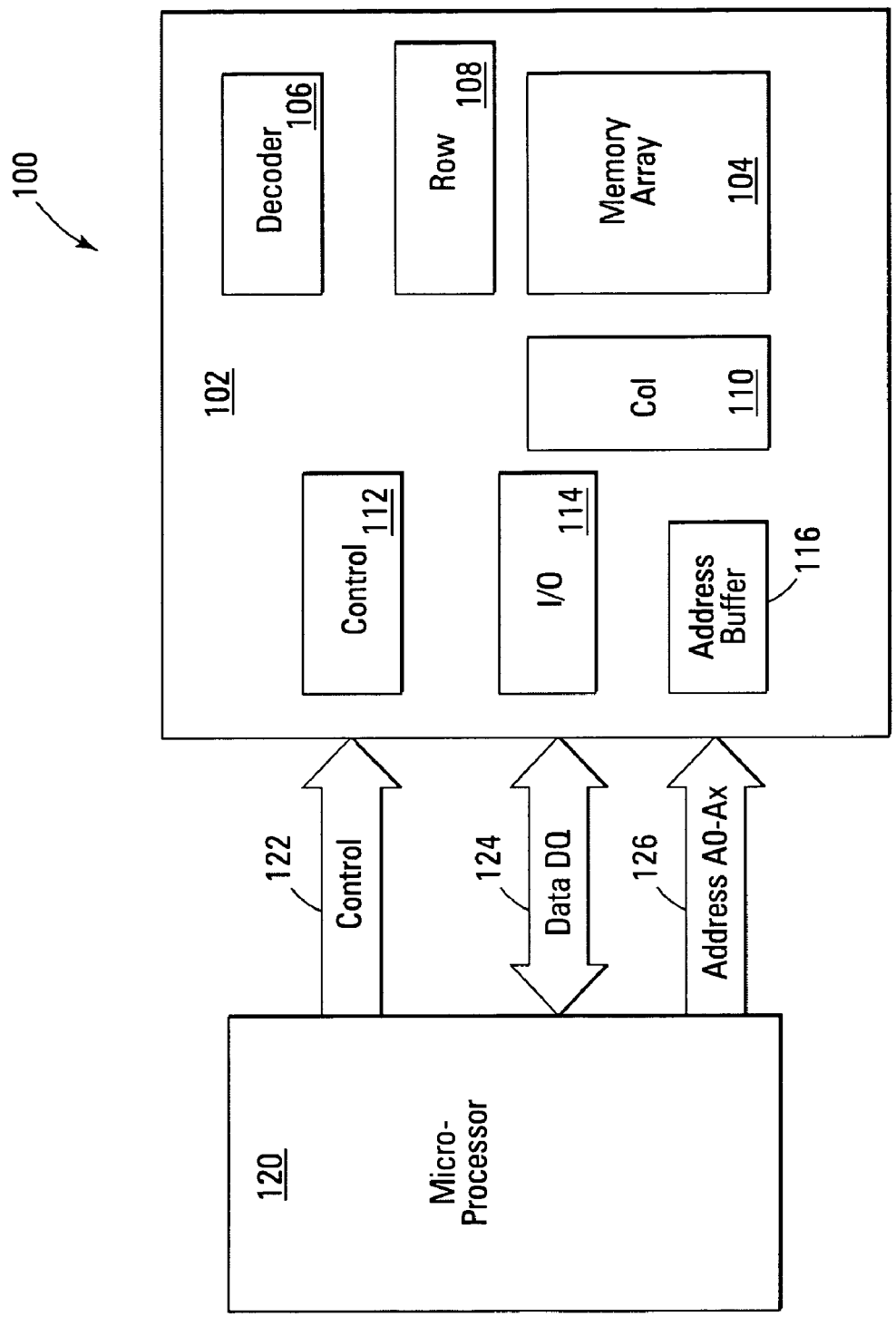
FIG. 1 is a simplified block diagram of a memory system in accordance with an embodiment of the invention.

FIG. 1 is a simplified block diagram of a memory system 100, according to an embodiment of the invention. Memory system 100 includes an integrated circuit flash memory device 102 that includes an array of floating-gate memory cells 104, an address decoder 106, row access circuitry 108, column access circuitry 110, control circuitry 112, Input/Output (I/O) circuitry 114, and an address buffer 116. Memory system 100 includes an external microprocessor 120, or memory controller, electrically connected to memory device 102 for memory accessing as part of an electronic system. The memory device 102 receives control signals from the processor 120 over a control link 122. The memory cells are used to store data that are accessed via a data (DQ) link 124. Address signals are received via an address link 126 that are decoded at address decoder 106 to access the memory array 104. Address buffer circuit 116 latches the address signals. The memory cells are accessed in response to the control signals and the address signals. It will be appreciated by those skilled in the art that additional circuitry and control signals can be provided, and that the memory device of FIG. 1 has been simplified to help focus on the invention. The memory array 104 includes memory cells having carbon nanotubes in accordance with the invention. The memory array 104 can include a variety of architectures, such as a NAND architecture or a NOR architecture.

Figure 2:
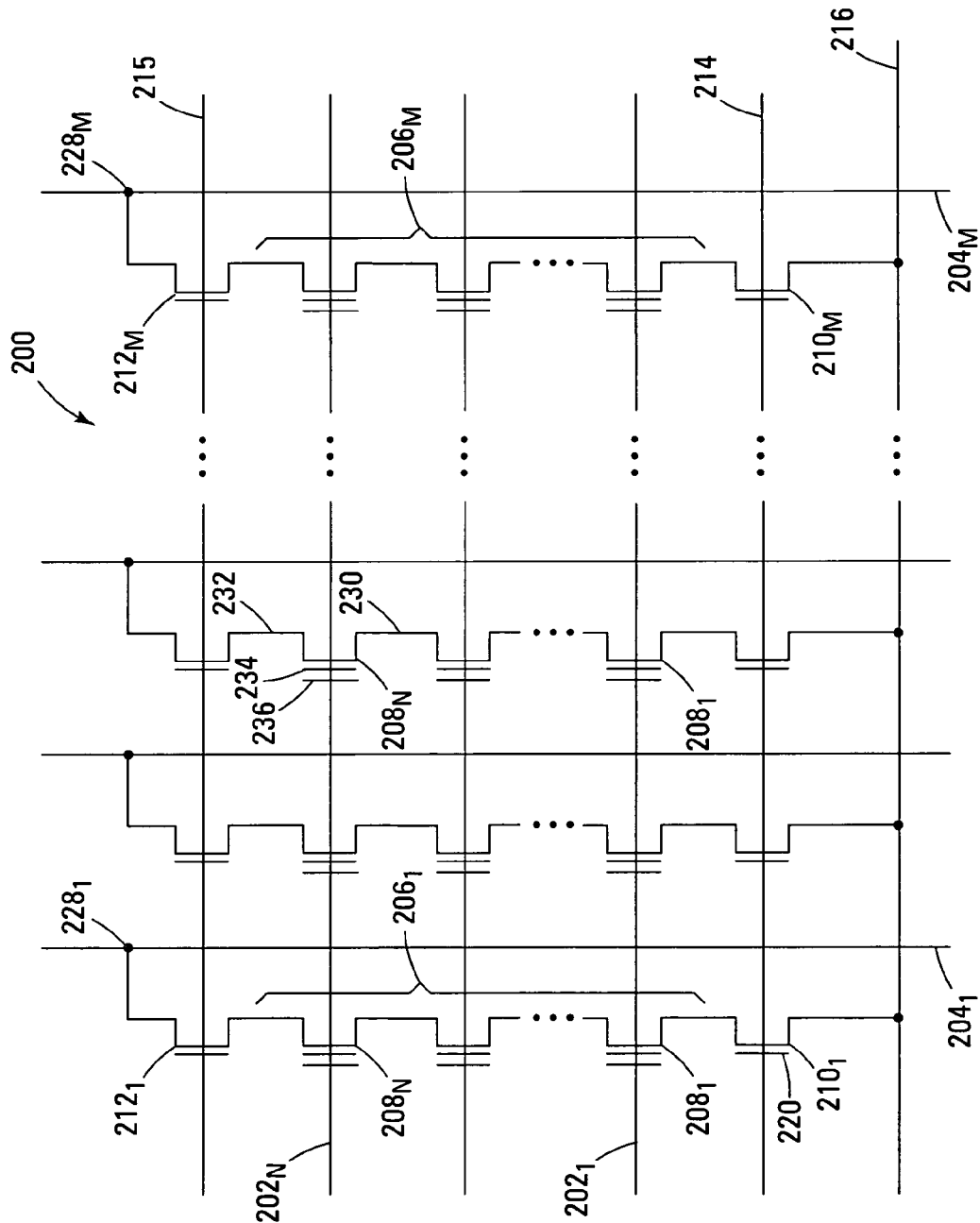
FIG. 2 is a schematic of a NAND memory array in accordance with an embodiment of the invention.

FIG. 2 is a schematic of a NAND memory array 200 as a portion of memory array 104 of FIG. 1 in accordance with another embodiment of the invention. As shown in FIG. 2, the memory array 200 includes word lines $202_1$ to $202_N$ and intersecting bit lines $204_1$ to $204_M$. For ease of addressing in the digital environment, the number of word lines 202 and the number of bit lines 204 are each some power of two, e.g., 256 word lines 202 by 4,096 bit lines 204.

Memory array 200 includes NAND strings $206_1$ to $206_M$. Each NAND string includes floating-gate transistors $208_1$ to $208_N$, each located at an intersection of a word line 202 and a bit line 204. The floating-gate transistors 208 represent non-volatile memory cells for storage of data. The floating-gate transistors 208 of each NAND string 206 are connected in series source to drain between a source select gate 210, e.g., a field-effect transistor (FET), and a drain select gate 212, e.g., an FET. Each source select gate 210 is located at an intersection of a bit line 204 and a source select line 214, while each drain select gate 212 is located at an intersection of a bit line 204 and a drain select line 215.

A source of each source select gate 210 is connected to a common source line 216. The drain of each source select gate 210 is connected to the source of the first floating-gate transistor 208 of the corresponding NAND string 206. For example, the drain of source select gate $210_1$ is connected to the source of floating-gate transistor $208_1$ of the corresponding NAND string $206_1$. A control gate 220 of each source select gate 210 is connected to source select line 214.

The drain of each drain select gate 212 is connected to a bit line 204 for the corresponding NAND string at a drain contact 228. For example, the drain of drain select gate $212_1$ is connected to the bit line $204_1$ for the corresponding NAND string $206_1$ at drain contact $228_1$. The source of each drain select gate 212 is connected to the drain of the last floating-gate transistor 208 of the corresponding NAND string 206. For example, the source of drain select gate $212_1$ is connected to the drain of floating-gate transistor $208_N$ of the corresponding NAND string $206_1$.

Construction of floating-gate transistors 208 includes a source 230 and a drain 232, a floating gate 234, and a control gate 236, as shown in FIG. 2. The floating-gate transistors 208 further have carbon nanotubes (not shown in FIG. 2) interposed between its floating gate 234 and its source 230 and drain 232. Floating-gate transistors 208 have their control gates 236 coupled to a word line 202. A column of the floating-gate transistors 208 are those NAND strings 206 coupled to a given bit line 204. A row of the floating-gate transistors 208 are those transistors commonly coupled to a given word line 202.

Figure 3:
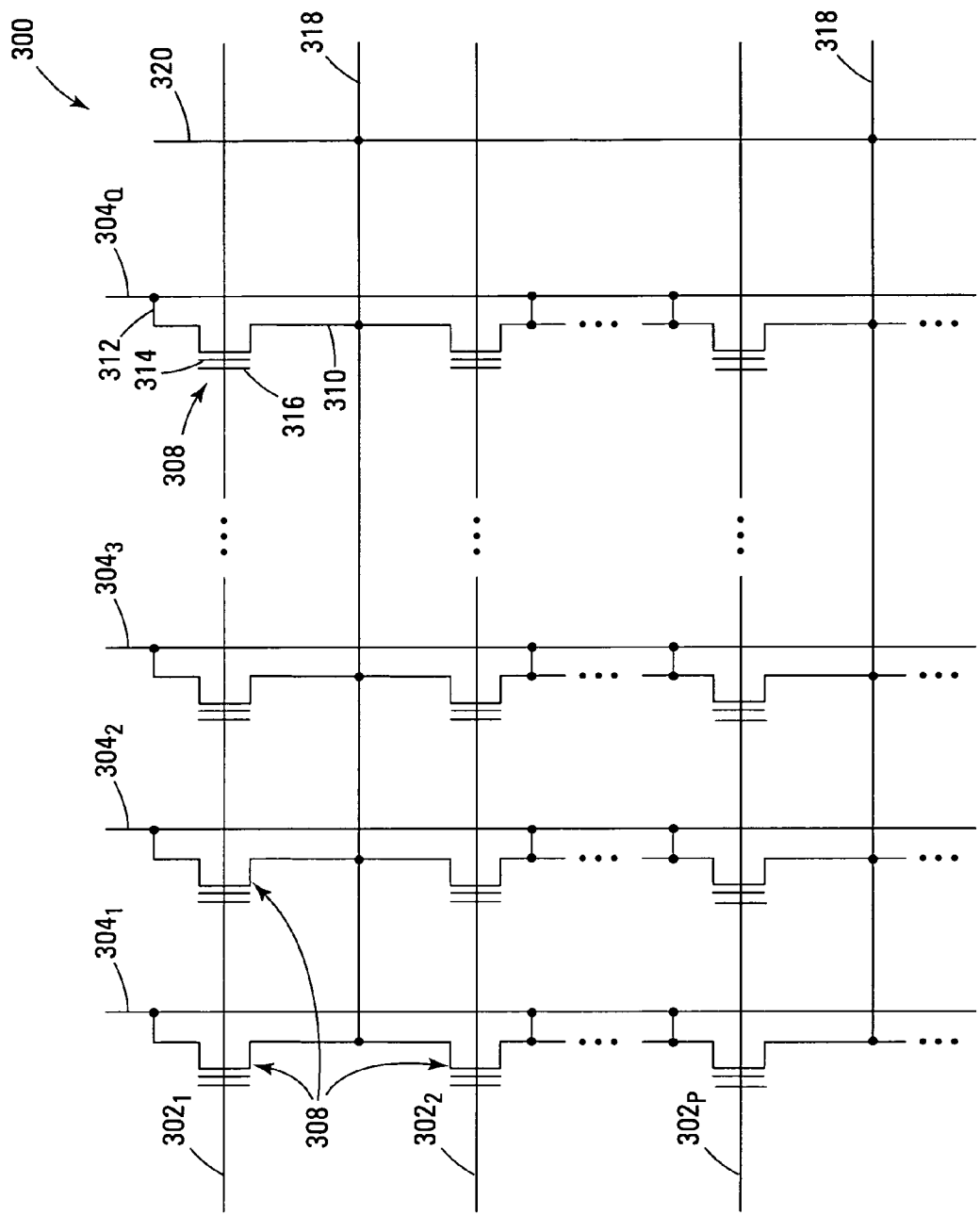
FIG. 3 is a schematic of a NOR memory array in accordance with an embodiment of the invention.

FIG. 3 is a schematic of a NOR memory array 300 as a portion of memory array 104 of FIG. 1 in accordance with another embodiment of the invention. Memory array 300 includes word lines $302_1$ to $302_P$ and intersecting local bit lines $304_1$ to $304_Q$. For ease of addressing in the digital environment, the number of word lines 302 and the number of bit lines 304 are each some power of two, e.g., 256 word lines 302 by 4,096 bit lines 304. The local bit lines 304 are coupled to global bit lines (not shown) in a many-to-one relationship.

Floating-gate transistors 308 are located at each intersection of a word line 302 and a local bit line 304. The floating-gate transistors 308 represent non-volatile memory cells for storage of data. Construction of floating-gate transistors 308 includes a source 310 and a drain 312, a floating gate 314, and a control gate 316, as shown in FIG. 3. The floating-gate transistors 308 further have carbon nanotubes (not shown in FIG. 3) interposed between its floating gate 314 and its source 310 and drain 312.

Floating-gate transistors 308 having their control gates 316 coupled to a word line 302 typically share a common source depicted as array source 318. As shown in FIG. 3, floating-gate transistors 308 coupled to two adjacent word lines 302 may share the same array source 318. Floating-gate transistors 308 have their drains 312 coupled to a local bit line 304. A column of the floating-gate transistors 308 includes those transistors commonly coupled to a given local bit line 304. A row of the floating-gate transistors 308 includes those transistors commonly coupled to a given word line 302.

To reduce problems associated with high resistance levels in the array source 318, the array source 318 may be regularly coupled to a metal or other highly conductive line to provide a low-resistance path to ground. The array ground 320 serves as this low-resistance path.

FIGS. 4A-4D are cross-sectional views of floating-gate transistors or memory cells 400A-400D, respectively, in accordance with embodiments of the invention. The memory cells 400A-400D are formed on a semiconductor substrate 405. For one embodiment, the substrate 405 is a monocrystalline silicon substrate. For a further embodiment, substrate 405 is a p-type monocrystalline silicon substrate.

Source/drain regions 410 are formed in the substrate 405. Channel regions of the memory cells 400A-400D are defined by the areas of the substrate 405 between the source/drain regions 410. Source/drain regions 410 will generally have a conductivity type opposite the conductivity type of the substrate 405. For example, for a p-type substrate 405, the source/drain regions 410 might have an n-type conductivity.

An interlayer dielectric 415 is formed overlying the substrate 405. The interlayer dielectric 415 may include one or more layers of dielectric material. These layers of dielectric material may be formed by a variety of methods, such as blanket deposition of a dielectric material by chemical vapor deposition (CVD) or physical vapor deposition (PVD). Such layers may also be formed using a spin-on dielectric material. Spin-on dielectrics are liquid materials that are applied to a surface and cured to form a dielectric layer, e.g., hydrogen silsesquioxane (HSQ), hexamethyldisiloxane, octamethyltrisiloxane, etc. The dielectric materials may generally be any dielectric material that is selective over the dielectric material chosen for the tunnel dielectric layer 425. For example, if silicon dioxide ($SiO_2$) is chosen for the tunnel dielectric layer 425, silicon nitride ($Si_3N_4$) could be chosen for the interlayer dielectric 415 as portions of the tunnel dielectric layer 425 could be removed without materially damaging the interlayer dielectric 415.

Carbon nanotubes 420 (not shown in FIG. 4D) are formed in the interlayer dielectric 415 extending from the substrate 405 to the tunnel dielectric layer 425. At least a portion of the carbon nanotubes 420 should be overlying or adjacent one or both of the source/drain regions 410. Carbon nanotubes are networks of carbon atoms assuming a generally cylindrical shape. They occur in a variety of types, including single-walled and multi-walled, and can have conductivity ranging from metallic to semiconducting to substantially insulating. The carbon nanotubes 420 can include a variety of nanotube types and conductivity provided that at least some of the carbon nanotubes extending from the source/drain regions 410 to the tunnel dielectric layer 425 are metallic or semiconducting in nature. However, under typical process conditions for the formation of carbon nanotubes, a large number of metallic carbon nanotubes will be formed.

The carbon nanotubes 420 are generally conductive only along their length, exhibiting substantially insulating properties along their width. For the embodiment shown in FIG. 4A, the carbon nanotubes 420 extend substantially along the entire width of the channel of the memory cell 400A with at least some of the carbon nanotubes 420 in contact with the source/drain regions 410. For the embodiment shown in FIG. 4B, at least some of the carbon nanotubes 420 are in contact with both source/drain regions 410, but there is at least one break or discontinuity 455 such that the carbon nanotubes 420 do not extend contiguously along the entire width of the channel of the memory cell 400B. The embodiment shown in FIGS. 4C demonstrates that the tunnel dielectric layer 425 may be formed to be in contact with the substrate 405, thereby permitting the floating-gate layer 430 to be adjacent to the channel region between pillars or ridges of carbon nanotubes 420, thus providing a more effective change in the threshold voltage of the device. While contact of the carbon nanotubes 420 with one or both source/drain regions 410 facilitates generation of a field across the carbon nanotubes 420 for writing or reading the memory cells 400A-400C, embodiments of the invention do not require contact between the source/drain regions 410 and the carbon nanotubes 420. That is, carbon nanotubes 420 formed in the interlayer dielectric 415 could be limited to the channel regions of the memory cells 400A-400C.

Figure 4A:
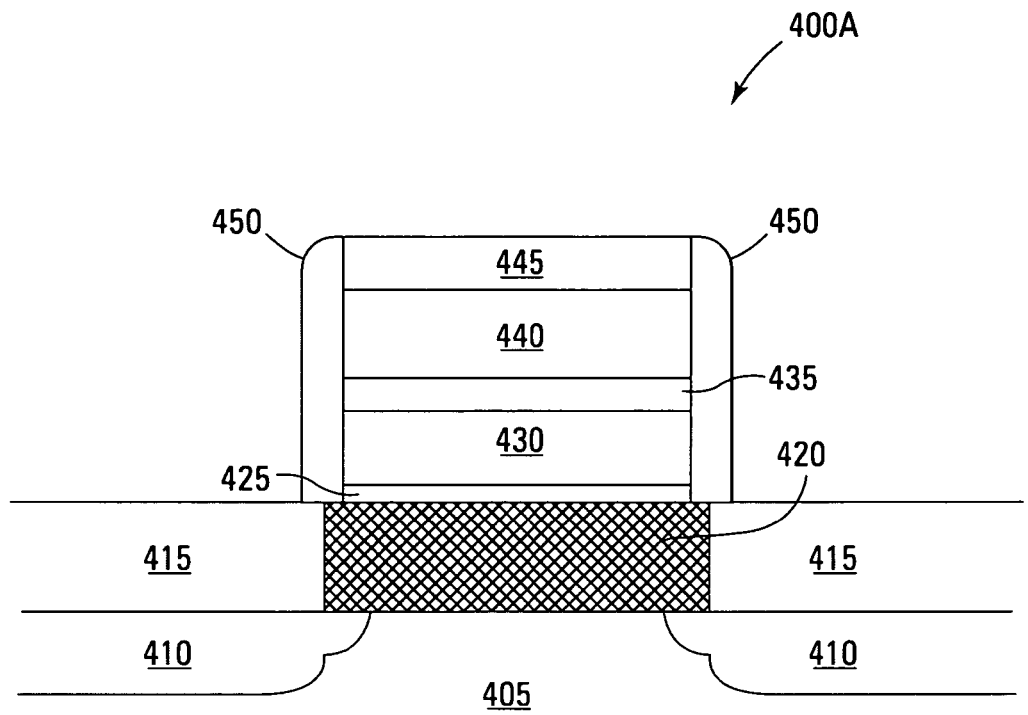
FIGS. 4A-4E are cross-sectional views of memory cells in accordance with embodiments of the invention.
Figure 4B:
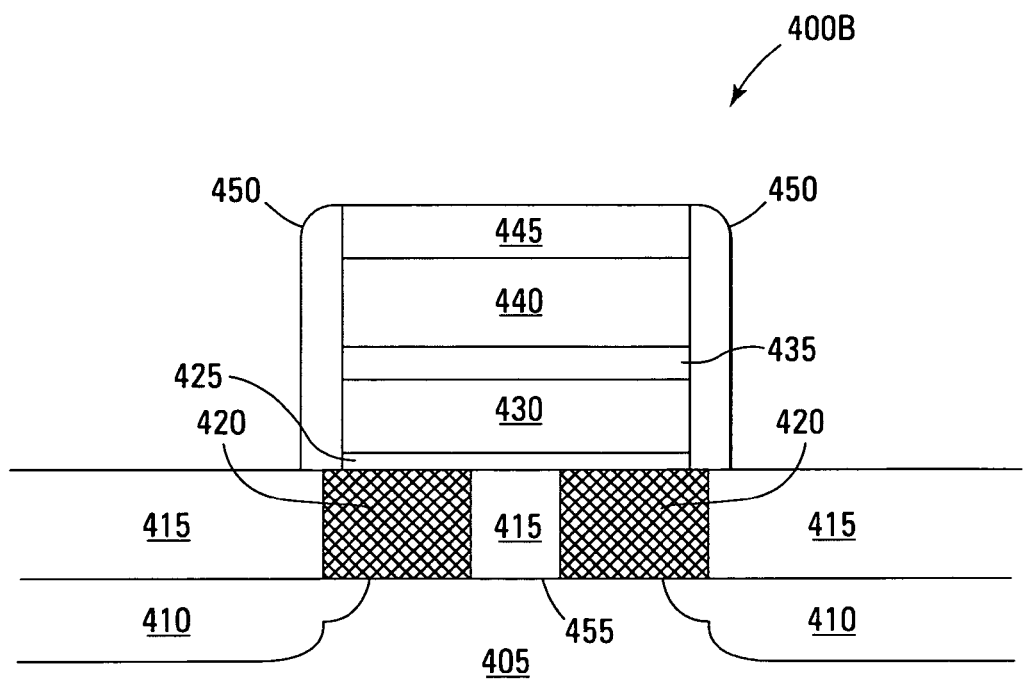
Figure 4C:
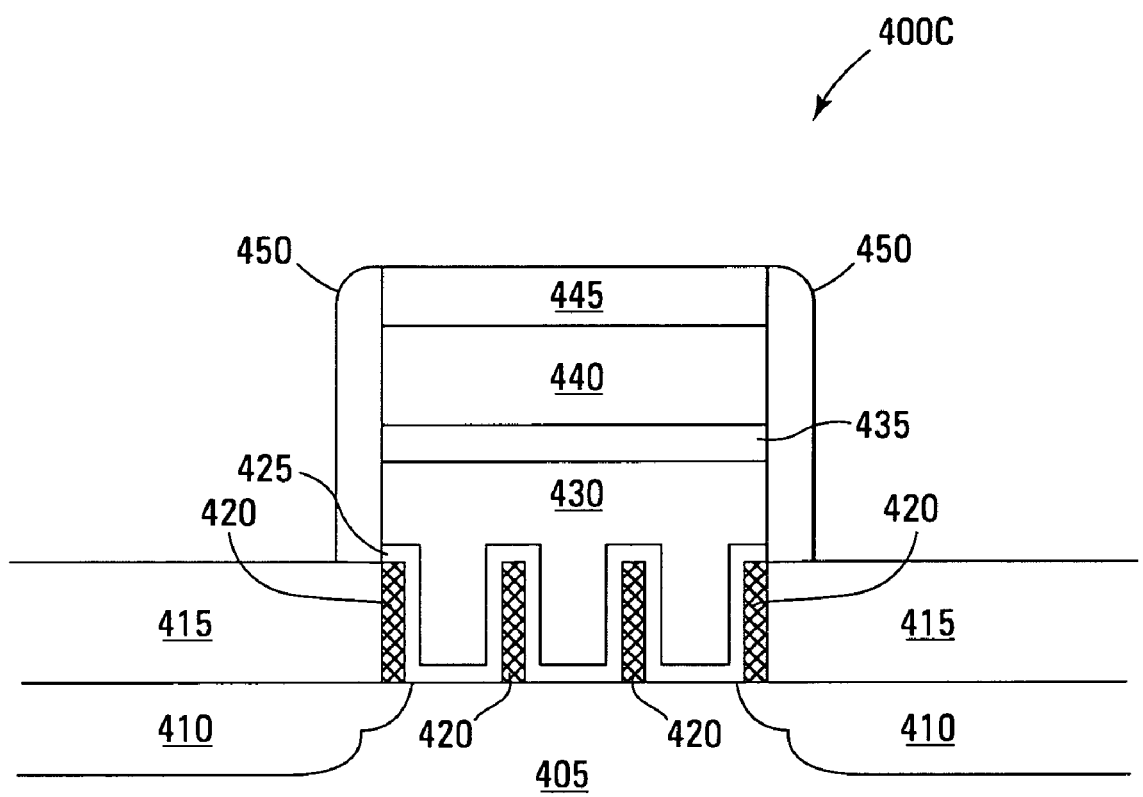
Figure 4D:
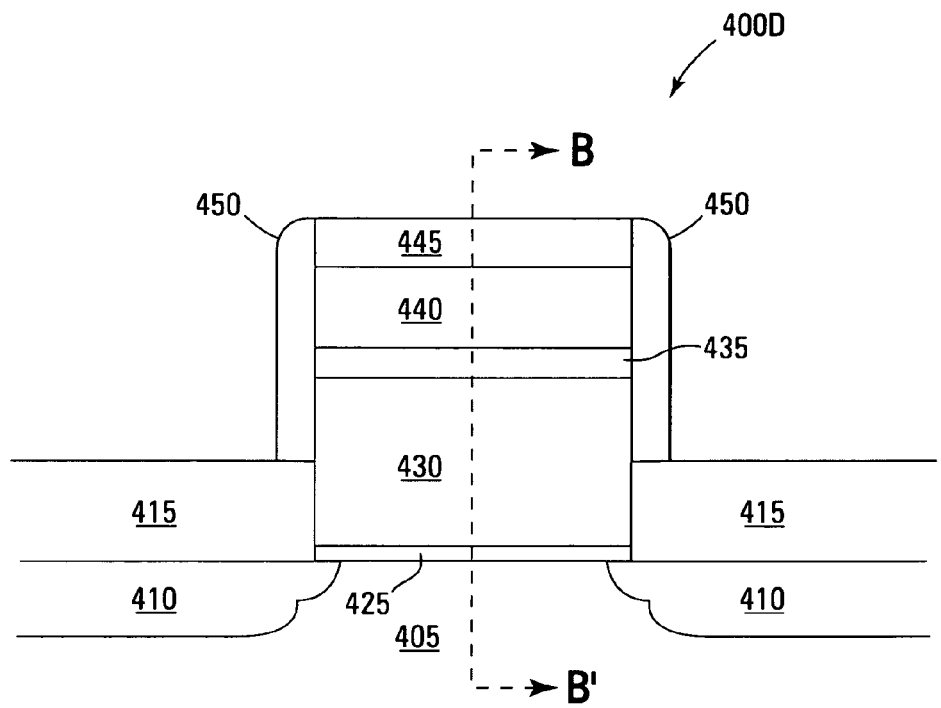
Figure 4E:
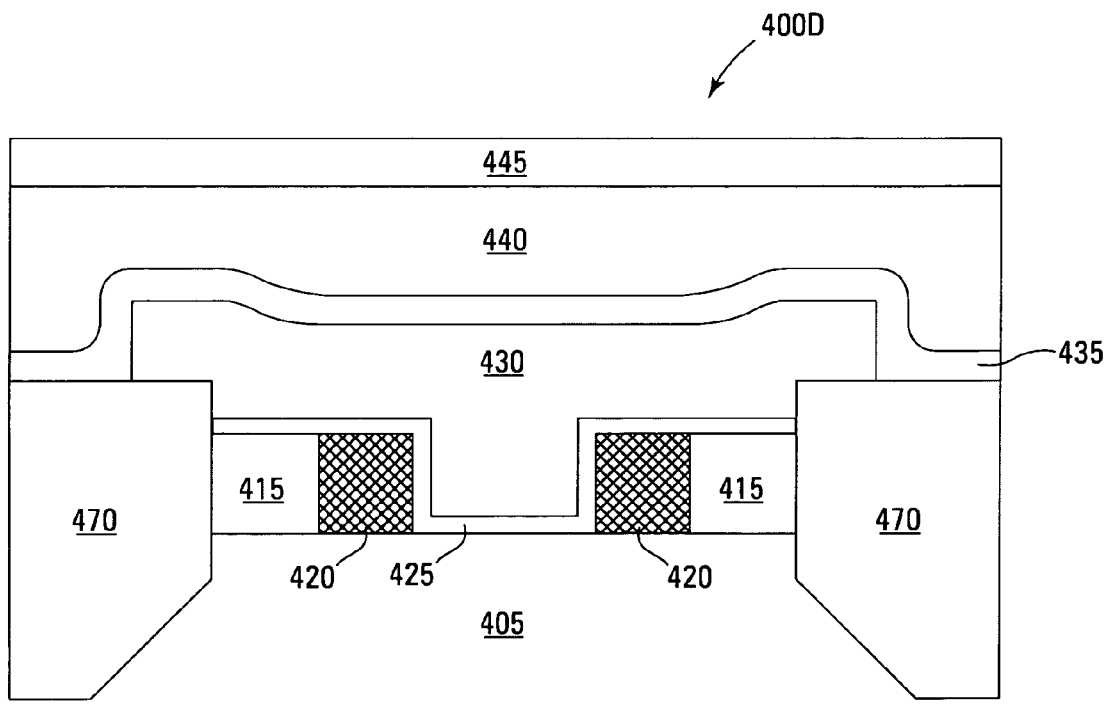

The embodiment depicted in FIG. 4D demonstrates that portions of the channel region and source/drain regions 410 may be substantially devoid of carbon nanotubes. This permits the floating-gate layer 430 to be adjacent the channel region along its entire width. FIG. 4E is a view of the memory cell 400D of FIG. 4D taken along line B-B' showing that the carbon nanotubes 420 could be formed only near edges of the channel region along its width. The carbon nanotubes 420 for memory cell 400D may extend between the source/drain regions 410, such as with memory cell 400A, or they may contain breaks or discontinuities filled with dielectric material, such as with memory cell 400B, or they may contain breaks or discontinuities permitting the tunnel dielectric layer 425 to be formed on the substrate 405, such as with memory cell 400C. Note that the intergate dielectric layer 435, control gate layer 440 and cap layer 445 may be shared with adjacent memory cells (not shown in FIG. 4E) separated by isolation regions 470.

Returning to the general discussion of the memory cells 400A-400D, tunnel dielectric layer 425 is formed overlying the carbon nanotubes 420 and may or may not be in contact with the substrate 405. The tunnel dielectric layer 425 could be formed by a blanket deposition of a dielectric material, such as by CVD or PVD. Tunnel dielectric layer 425 is generally a silicon oxide ($SiO_2$), but may include other dielectric materials, including silicon nitride ($Si_3N_4$) and silicon oxynitrides ($Si_xO_yN_z$) as well as high-K dielectrics. Some examples of high-K dielectric materials include dielectric metal oxides, including barium strontium titanate (BST), lead zirconium titanate (PZT) and lead lanthanum titanate (PLZT), $Al_2O_3$, AlO, HfO, ZrO and others. Other classes of high-K dielectrics include dielectric metal oxynitrides and dielectric metal silicates.

A floating-gate layer 430 is formed overlying the tunnel dielectric layer 425. The floating-gate layer 430 is one or more layers of material that will store the charge indicative of a programmed state of the floating-gate memory cells 400A-400D. The floating-gate layer 430 is preferably a polysilicon (polycrystalline silicon) layer, but could also include other forms of doped or undoped silicon materials, such as monocrystalline silicon, nanocrystalline silicon and amorphous silicon, as well as other materials capable of holding a charge. The floating-gate layer 430 may be formed by such techniques as CVD or PVD, and may be conductively doped during or following formation.

The intergate dielectric layer 435 is formed overlying the floating-gate layer 430. The intergate dielectric layer 435 contains a dielectric material. Some examples include silicon oxides, silicon nitrides or silicon oxynitrides. Further examples include dielectric metal oxides such as BST, PZT, PLZT, Al2O3, AlO, HfO, ZrO and others, as well as dielectric metal oxynitrides and dielectric metal silicates. Dielectric layers may further contain multiple layers of dielectric materials. One common example is an ONO (oxide-nitride-oxide) dielectric layer.

A control-gate layer 440 is formed overlying the intergate dielectric layer 435. The control gate layer 440 is generally one or more layers of conductive material. For one embodiment, the control gate layer 440 contains a conductively-doped polysilicon. For a further embodiment, the control gate layer 440 includes a metal-containing layer overlying a polysilicon layer, e.g., a refractory metal silicide layer formed on a conductively-doped polysilicon layer. The metals of chromium (Cr), cobalt (Co), hafnium (Hf), molybdenum (Mo), niobium (Nb), tantalum (Ta), titanium (Ti), tungsten (W), vanadium (V) and zirconium (Zr) are generally recognized as refractory metals. For another embodiment, the control gate layer 440 contains multiple metal-containing layers, e.g., a titanium nitride (TiN) barrier layer overlying the intergate dielectric layer 435, a titanium (Ti) adhesion layer overlying the barrier layer and a tungsten (W) layer overlying the adhesion layer.

A cap layer 445 is generally formed overlying the control-gate layer 440 to act as an insulator and barrier layer to protect the control-gate layer 440 during subsequent processing. The cap layer 445 contains a dielectric material and may include such dielectrics as silicon oxide, silicon nitride, and silicon oxynitrides. For one embodiment, the cap layer 445 is silicon nitride, formed by such methods as CVD.

The gate stack, i.e., tunnel dielectric layer 425, floating-gate layer 430, intergate dielectric layer 435, control-gate layer 440 and cap layer 445, may be patterned to define word lines of a memory device. It is noted that additional layers may form the gate stack, such as barrier layers to inhibit diffusion between opposing layers or adhesion layers to promote adhesion between opposing layers. Sidewall spacers 450 may be formed on the sidewalls of the gate stacks to protect and insulate the sidewalls. Sidewall spacers 450 are typically the same dielectric material as used for the cap layer 445, but may include other dielectric materials. Formation may include a blanket deposit of a layer of dielectric material on the patterned gate stacks followed by an anisotropic etch to preferentially remove horizontal portions of the layer of dielectric material, leaving vertical portions adjacent the sidewalls of the gate stacks.

FIGS. 5A-5L generally depict a method of forming a portion of a memory array in accordance with one embodiment of the invention. Guidelines for materials of construction may generally be the same as provided with reference to FIGS. 4A-4E.

Figure 5A:
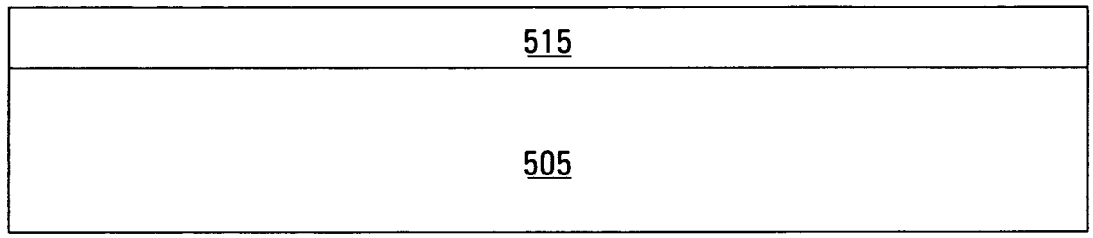
FIGS. 5A-5L are cross-sectional views of a memory cell at various stages of fabrication in accordance with embodiments of the invention.

FIG. 5A depicts a portion of the memory array after several processing steps have occurred. Formation of the type of structure depicted in FIG. 5A is well known and will not be detailed herein. In general, FIG. 5A depicts a substrate 505 upon which interlayer dielectric 515 has been formed. The interlayer dielectric 515 is formed overlying an active region of the substrate 505, over which memory cells will be formed. For one embodiment, the interlayer dielectric 515 has a thickness of approximately 100 to 500 Angstroms or more.

Figure 5B:
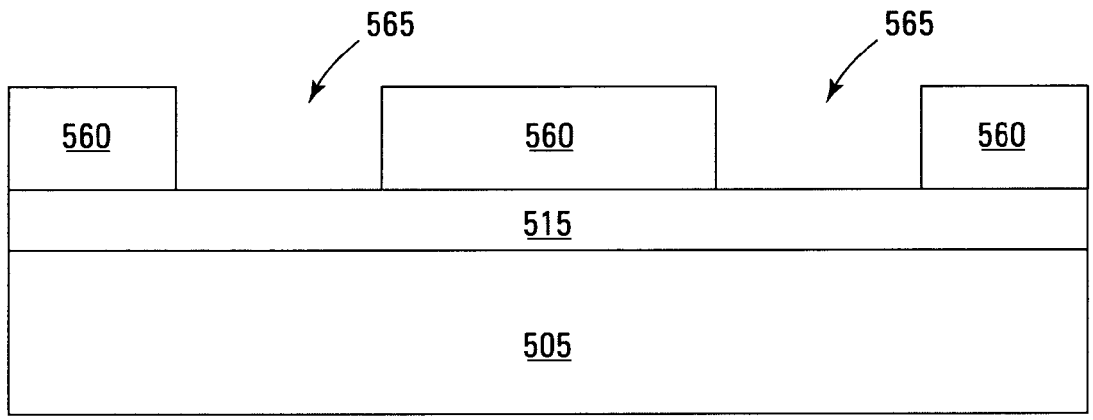
Figure 5C:
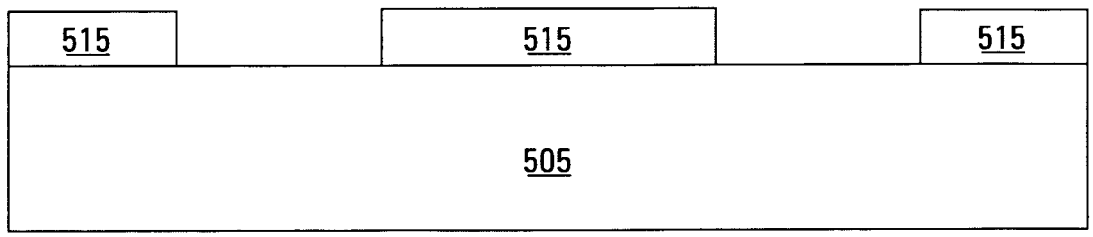

In FIG. 5B, a mask layer 560 is formed and patterned overlying the interlayer dielectric 515. As one example, a photolithographic resist material could be deposited as mask layer 560 overlying the interlayer dielectric 515, exposed to a radiation source, such as UV light, and developed to define areas 565 exposing portions of the interlayer dielectric 515. The exposed portions of the interlayer dielectric 515 are where future carbon nanotubes will be grown. Subsequently, in FIG. 5C, exposed portions of the interlayer dielectric 515 are removed, such as by etching or other removal process, thereby exposing portions of the substrate 505 as areas for growth of carbon nanotubes. As shown with respect to FIG. 4A, the area for carbon nanotubes may extend the entire width of a channel of a memory cell. FIG. 5C corresponds to the embodiment of a memory cell depicted in FIG. 4A, with each of the exposed areas of substrate 505 corresponding to one future memory cell in a row of memory cells. To form the embodiment of a memory cell depicted in FIG. 4B, the interlayer dielectric 515 could be patterned to exposed two separated portions of the substrate 505 for each memory cell of a row of memory cells in a manner that is readily apparent. Forming embodiments of a memory cell depicted in FIGS. 4C-4E will be described separately.

Figure 5D:
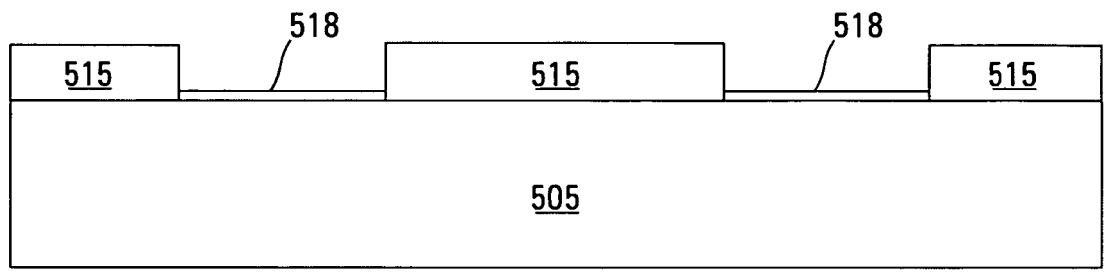

In FIG. 5D, a seed layer 518 may be formed on the exposed portions of the substrate 505. The seed layer 518 provides additional nucleation sites upon which carbon nanotubes can be more easily formed. However, carbon nanotubes can be formed directly upon the underlying substrate 505. For one embodiment, the seed layer 518 includes one or more catalytic metals, e.g., zinc, nickel, cobalt or iron, and can be formed using a variety of techniques, such as CVD or PVD. For one embodiment, the seed layer 518 is formed by sputtering from a metal target. With CVD techniques, formation of the seed layer 518 may be preferential to the substrate. Formation of the seed layer 518 may further be preferential to the substrate 505 in PVD techniques provided an appropriate bias is applied to the substrate 505. However, if undesired seed layer is formed on the surface of the interlayer dielectric 515, this excess material may be removed, such as by a chemical-mechanical planarization (CMP) technique, to reduce the likelihood of carbon nanotubes being grown on the surface of the interlayer dielectric 515. An anneal of the seed layer 518 may be performed after formation to alter the crystalline structure and/or to better bond the seed layer 518 in the underlying substrate 505.

Figure 5E:
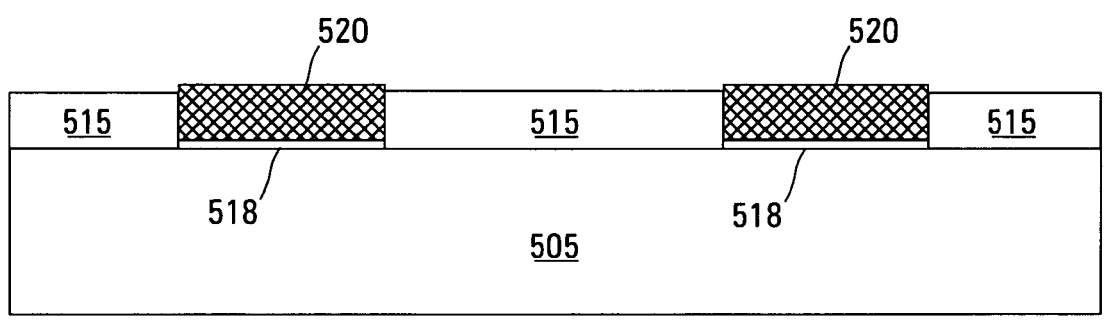

If FIG. 5E, carbon nanotubes 520 are formed on the seed layer 518. As noted with respect to FIG. 5D, the carbon nanotubes 520 could alternatively be formed on the substrate 505. Growth of carbon nanotubes 520 is well understood. In general, the seed layer 518 or substrate 505 is exposed to a carbon ambient, such as a hydrocarbon plasma, and growth of the carbon nanotubes 520 will extend from nucleation sites generally orthogonal to the substrate 505. To increase the likelihood of growth orthogonal to the plane of the substrate 505, an electric field can be generated across the substrate to facilitate guiding the growth of the carbon nanotubes 520. For one embodiment, the carbon source for the plasma is a metal-organic hydrocarbon. Growth of the carbon nanotubes 520 preferably is continued until they extend to the surface of the interlayer dielectric 515 or above. However, growth can be halted prior to reaching the surface of the interlayer dielectric 515, with the excess interlayer dielectric 515 being removed to expose the carbon nanotubes 520 prior to forming a tunnel dielectric layer (not shown in FIG. 5E).

As alluded to previously, growth of carbon nanotubes generally produces a variety of forms, including single-walled and multi-walled structures, and a variety of conductivity levels. While techniques for formation of carbon nanotubes can be controlled to favor one form or conductivity level, for purposes of the various embodiments it is not necessary to do so. However, carbon nanotubes having single-walled metallic characteristics are preferred. As noted with respect to FIG. 4B, discontinuities are acceptable in the carbon nanotubes 520. These discontinuities may be intentional, such as by forming a separate cluster of carbon nanotubes at each source/drain region, or as a result of the processing, such as where nucleation does not occur sufficient to grow the nanotubes in a contiguous cluster across the width of the channel. In addition, selective removal of portions of the carbon nanotubes 520, such as by a patterned etch-back, may be performed before or after forming dielectric layer 517 (FIG. 5F) to create the discontinuities.

Figure 5F:
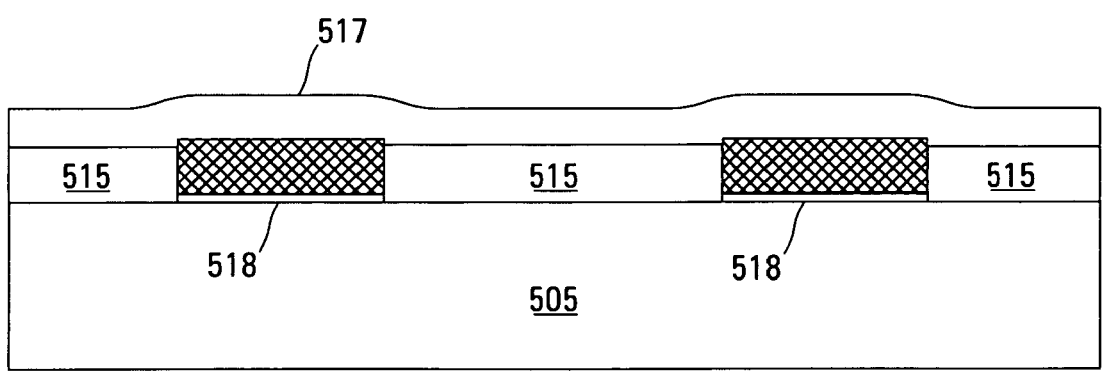
Figure 5G:
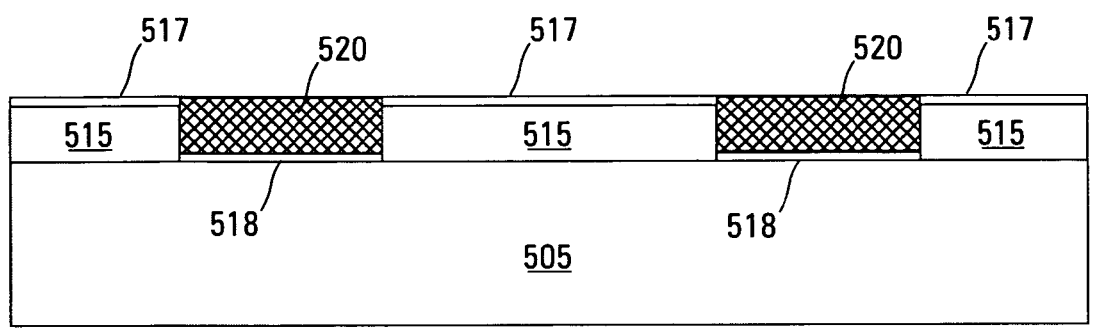

Following formation of the carbon nanotubes 520, a dielectric layer 517 may be formed as shown in FIG. 5F. The dielectric layer 517 may be used to provide structural support for subsequent processing by filling tips of the carbon nanotubes 520 with dielectric material. The dielectric layer 517 may also be used to fill in any discontinuities or spaces in between carbon nanotubes that may occur during the growth of the nanotubes. The dielectric layer 517 may be a spin-on, CVD or PVD dielectric material. Portions of the dielectric layer 517 are then removed in FIG. 5G to expose tips of the carbon nanotubes 520. For one embodiment, removal of portions of the dielectric layer 517 is performed as a CMP process using the carbon nanotubes 520 as a stopping layer. This provides a planarized surface exposing the carbon nanotubes 520 for subsequent formation of the memory cells. The interlayer dielectric 515 and dielectric layer 517 collectively may be considered an interlayer dielectric of the future memory cells.

Figure 5H:
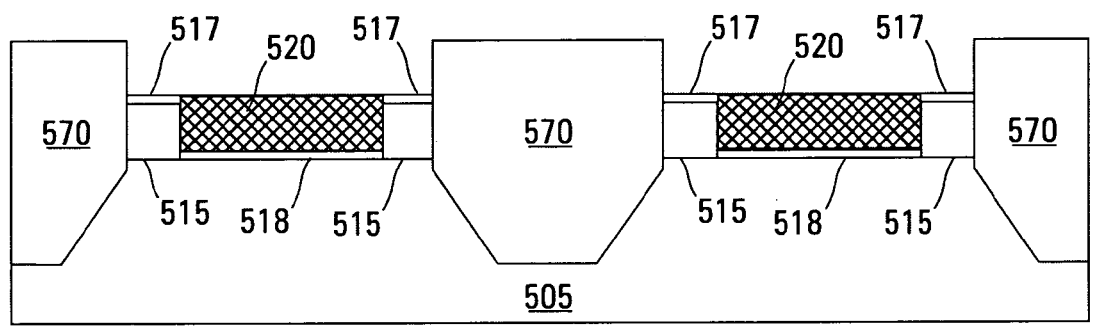

Isolation is generally required between columns of memory cells. If this isolation is not provided before formation of the carbon nanotubes 520, isolation can be provided at this stage, such as by the formation of isolation regions 570 as shown in FIG. 5H. For the embodiment as shown in FIG. 5H, the isolation regions 570 are shallow-trench isolation (STI) regions, commonly formed by creating a trench in the substrate 505 and filling the trench with a dielectric material. Isolation regions 570 are typically formed to extend above a tunnel dielectric layer of the future memory cell. This can be accomplished by forming one or more sacrificial layers (not shown) overlying the dielectric layer 517, forming the isolation regions 570, planarizing the resulting structure using the sacrificial layers as a stopping layer, and then removing the sacrificial layers to leave a structure as shown in FIG. 5H.

Figure 5I:
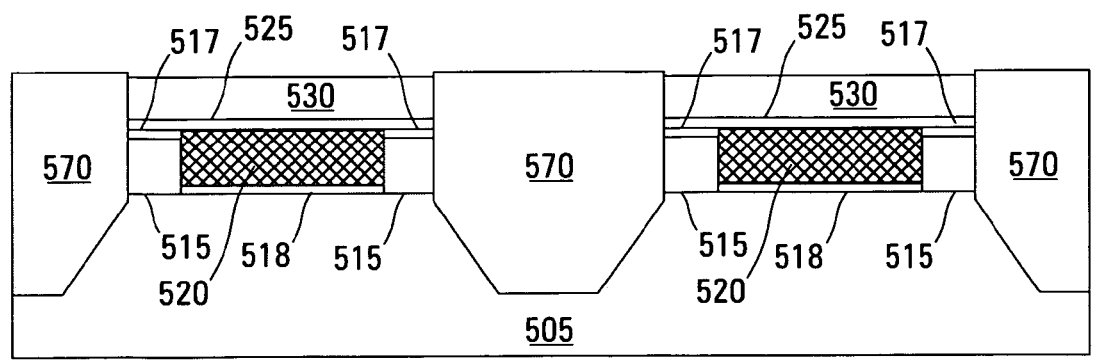

The isolation regions 570 are generally sized to provide an appropriate amount of isolation between the channel regions of adjacent memory cells. However, this can have the effect of limiting the length of the floating gate. To overcome this issue, the floating gate is often formed as more than one layer, e.g., one layer formed between the isolation regions 570 and a second layer formed to overlie a portion of the isolation regions 570. In FIG. 5I, a tunnel dielectric layer 525 is formed overlying the carbon nanotubes 520 and a first floating-gate layer 530 is formed overlying the tunnel dielectric layer 525. Tunnel dielectric layer 525 and first floating-gate layer 530 could also be formed prior to forming the isolation regions 570. Materials and formation of the first floating-gate layer 530 may follow the guidelines as presented with respect to the floating-gate layer 430 of FIGS. 4A-4E.

Figure 5J:
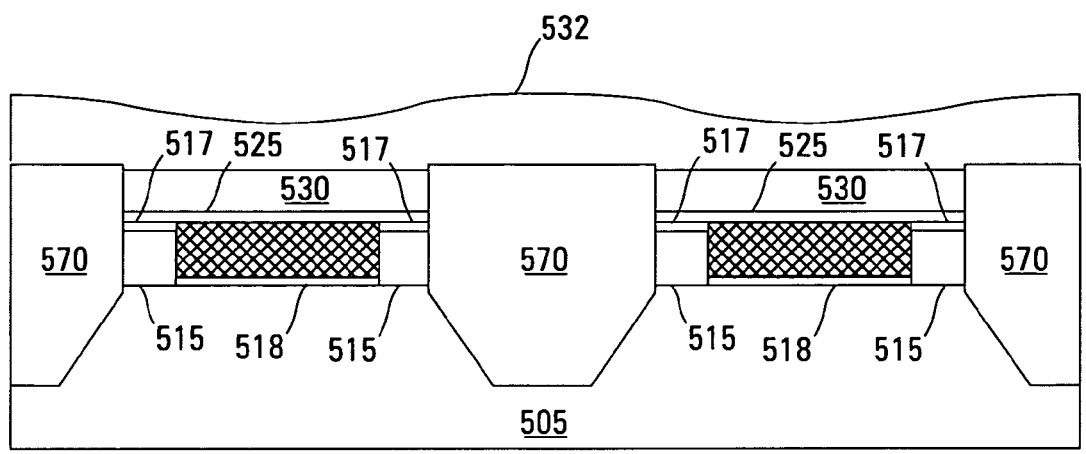
Figure 5K:
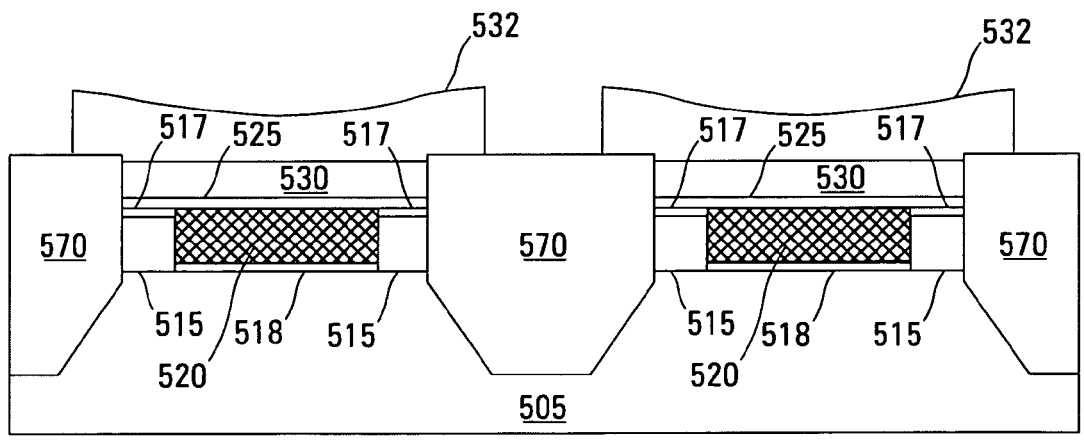

FIG. 5J, a second floating-gate layer 532 is formed overlying the first floating-gate layer 530 and the isolation regions 570. Materials and formation of the second floating-gate layer 532 may follow the guidelines as presented with respect to the floating-gate layer 430 of FIGS. 4A-4E. In FIG. 5K, portions of the second floating-gate layer 532 are removed, such as by forming and patterning a mask layer (not shown) to expose portions of the second floating-gate layer 532 overlying the isolation regions 570, and removing the exposed portions of the second floating-gate layer 532. For one embodiment, the first floating-gate layer 530 and the second floating-gate layer 532 collectively form floating-gate layers for future memory cells.

Figure 5L:
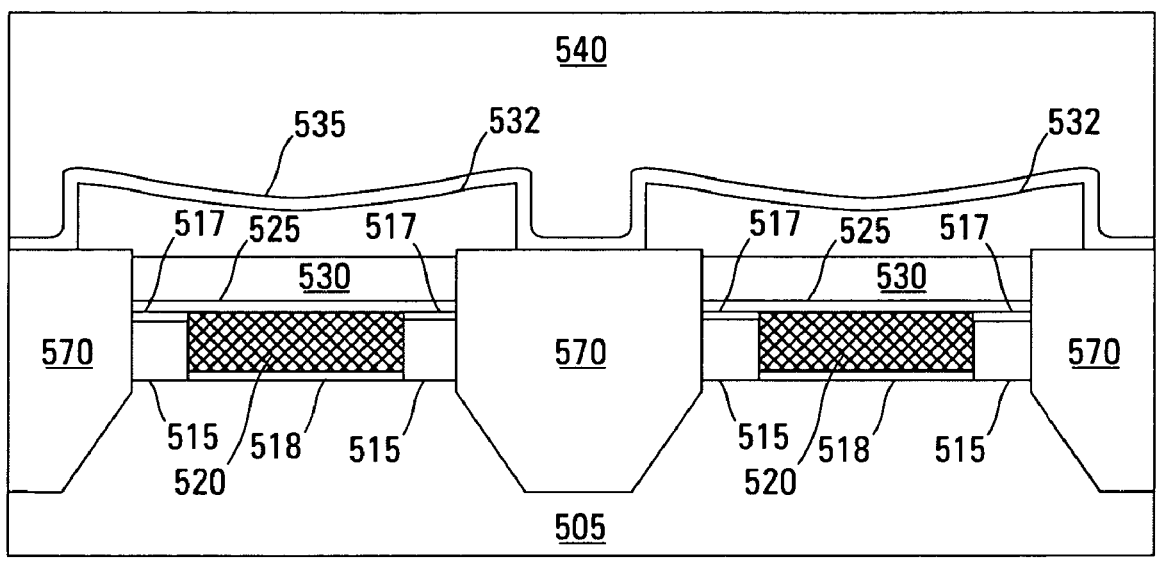

To complete the formation of the memory cells, an intergate dielectric layer 535 is formed overlying the second floating-gate layer 532 as depicted in FIG. 5L. The control gate layer 540 is formed overlying the intergate dielectric layer 535 and patterned to define word lines of the memory device. It is noted that FIGS. 5A-5L depict a portion of a row of memory cells running parallel to a face plane of the drawings. Columns of memory cells, separated by the isolation regions 570 run perpendicular to the drawings, with source and drain regions formed at opposing ends of the tunnel dielectric layer 525, one above the face plane of the figures and one below the face plane of the figures. It is noted that FIGS. 5A-5L can depict either a NOR-type memory device or a NAND-type memory device, with the differences occurring in the column direction in manners that are well understood in the art of memory fabrication.

FIGS. 6A-6E generally depict a method of forming a portion of a memory array in accordance with another embodiment of the invention. Guidelines for materials of construction may generally be the same as provided with reference to FIGS. 4A-4E. Formation of the structure depicted in FIG. 6A can be obtained as described with reference to FIGS. 5A-5G. The embodiment depicted in FIGS. 6A-6E demonstrates one example of forming the control gate of the memory cells to have at least a portion be adjacent the substrate.

Figure 6A:
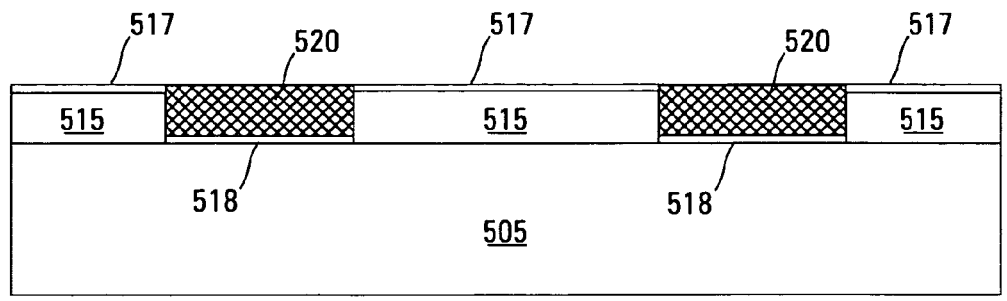
FIGS. 6A-6E are cross-sectional views of a memory cell at various stages of fabrication in accordance with further embodiments of the invention.
Figure 6B:
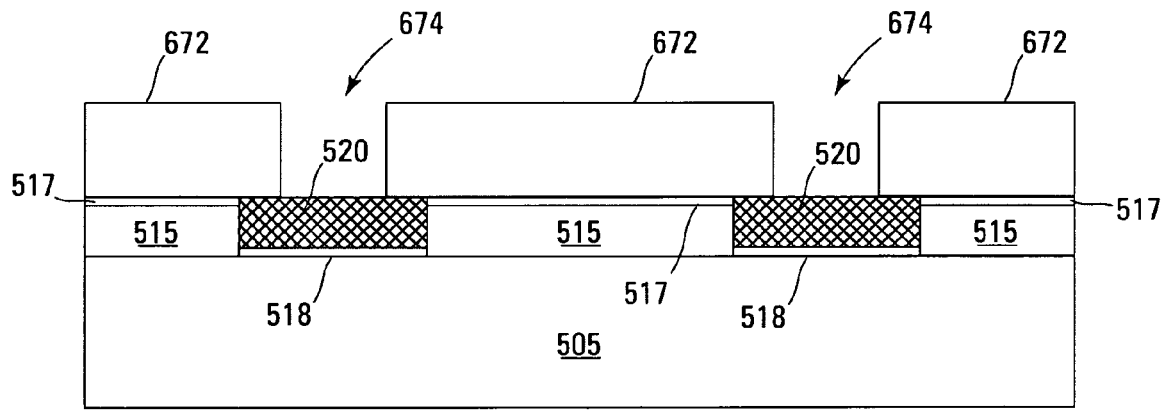

In FIG. 6B, a mask layer 672 is formed and patterned overlying the dielectric layers 515/517 and the carbon nanotubes 520, leaving portions of the carbon nanotubes 520 exposed. As one example, a photolithographic resist material could be deposited overlying the dielectric layers 515/517 and the carbon nanotubes 520, exposed to a radiation source, such as UV light, and developed to define areas 674 overlying the carbon nanotubes 520. the dielectric layers 515/517 and the carbon nanotubes 520. For one embodiment, the areas 674 define a single continuous exposed portion for each future memory cell, e.g., a rectangle extending between the source/drain regions of a future memory cell. For another embodiment, the areas 674 define a single non-continuous exposed portion for each future memory cell, e.g., a contiguous exposed portion defined to leave pillars of carbon nanotubes 520 covered by the mask layer 672 between the source/drain regions of a future memory cell. For a further embodiment, the areas 674 define two or more exposed portions for each future memory cell, e.g., areas defined to leave a contiguous pattern or grid of carbon nanotubes 520 covered by the mask layer 672 with pillars of carbon nanotubes 520 exposed between the source/drain regions of a future memory cell or areas defined to leave first blocks of carbon nanotubes 520 covered by the mask layer 672 with ridges or lines of carbon nanotubes 520 exposed between the source/drain regions of a future memory cell. Other patterns of mask layer 672 can be envisioned and the invention is not limited by any such pattern.

Figure 6C:
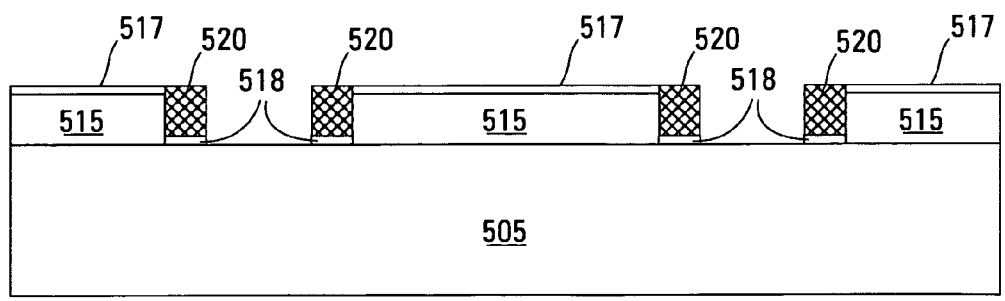

In FIG. 6C, exposed portions of the carbon nanotubes 520 are removed, such as by an anisotropic etch. If a seed layer 518 is used, its exposed portions may also be removed, thereby exposing portions of the substrate 505.

Figure 6D:
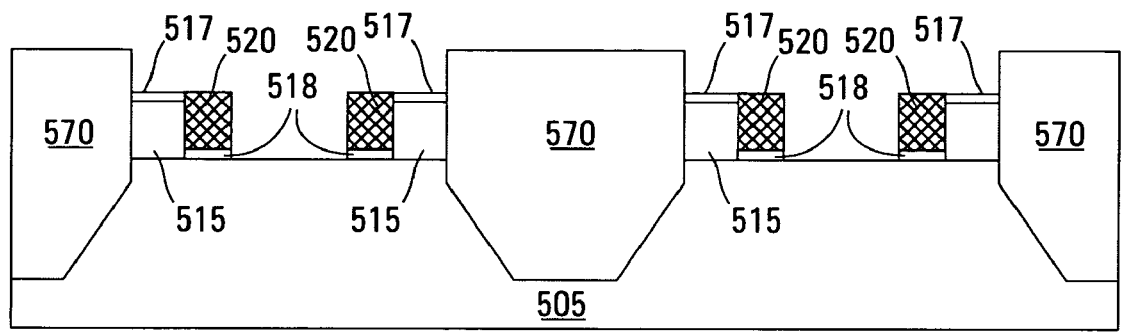

As described with reference to FIG. 5H, isolation is generally required between columns of memory cells. If this isolation is not provided before formation of the carbon nanotubes 520, isolation can be provided at this stage, such as by the formation of isolation regions 570 as shown in FIG. 6D. For the embodiment as shown in FIG. 6D, the isolation regions 570 are shallow-trench isolation (STI) regions, commonly formed by creating a trench in the substrate 505 and filling the trench with a dielectric material. Isolation regions 570 are typically formed to extend above a tunnel dielectric layer of the future memory cell. This can be accomplished by forming one or more sacrificial layers (not shown) overlying the dielectric layer 517, forming the isolation regions 570, planarizing the resulting structure using the sacrificial layers as a stopping layer, and then removing the sacrificial layers to leave a structure as shown in FIG. 6D.

Figure 6E:
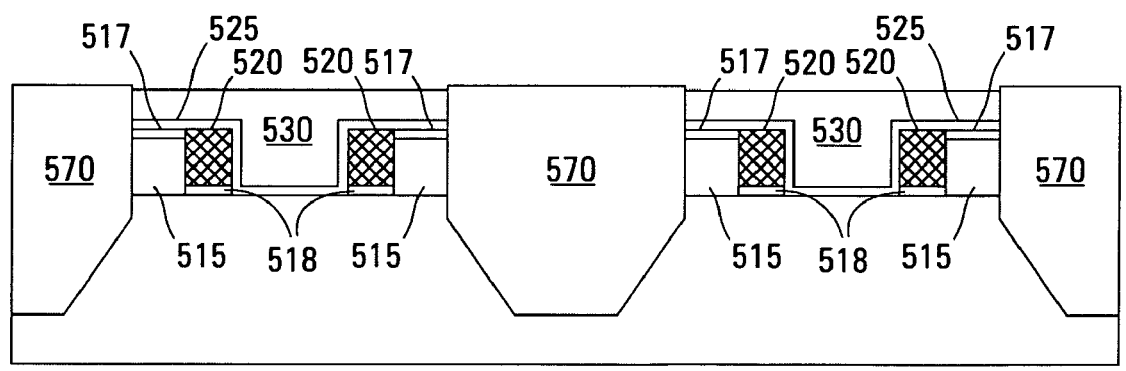

The isolation regions 570 are generally sized to provide an appropriate amount of isolation between the channel regions of adjacent memory cells. However, this can have the effect of limiting the length of the floating gate. To overcome this issue, the floating gate is often formed as more than one layer, e.g., one layer formed between the isolation regions 570 and a second layer formed to overlie a portion of the isolation regions 570. In FIG. 6E, a tunnel dielectric layer 525 is formed overlying the carbon nanotubes 520 and the exposed portions of the substrate 505, and a first floating-gate layer 530 is formed overlying the tunnel dielectric layer 525. Tunnel dielectric layer 525 and first floating-gate layer 530 could also be formed prior to forming the isolation regions 570. Materials and formation of the first floating-gate layer 530 may follow the guidelines as presented with respect to the floating-gate layer 430 of FIGS. 4A-4E. The memory cells may be completed as described with reference to FIGS. 5J-5L.

To program a memory cell in accordance with an embodiment of the invention, a field is created across the carbon nanotubes in order to inject charge carriers, e.g., electrons, into the floating-gate layer of the memory cell. Charge carriers are then removed from the floating-gate layer to erase the memory cell, thereby defining two programmed states. The absence or accumulation of charge on the floating-gate layer alters the threshold voltage of the memory cell. An erased memory cell, or a memory cell in a first programmed state, has a lower threshold voltage than a memory cell in a second programmed state and generally is associated with a logic high or logic 1 value. A memory cell in the second programmed state generally is associated with a logic low or logic 0 value.

It is known that electrons injected into carbon nanotubes at one end travel via ballistic transport through the tube and can reach very high velocities. When a sufficient field is generated across the carbon nanotubes, e.g., 4-5 V for common tunnel dielectric layers, electrons entering at one end of a carbon nanotube may be emitted from the other at velocities sufficient to be injected into the tunnel dielectric layer and accumulated in the floating-gate layer. A field sufficient for ballistic injection using the carbon nanotubes is generally lower than a field required for a memory cell having the same gate barrier characteristics using hot electron injection. Additionally, it is expected that faster programming speeds may be achieved using ballistic injection. Furthermore, ballistic injection may facilitate a higher charge density in the floating gate, thereby permitting a reduction in device size.

Figure 7:
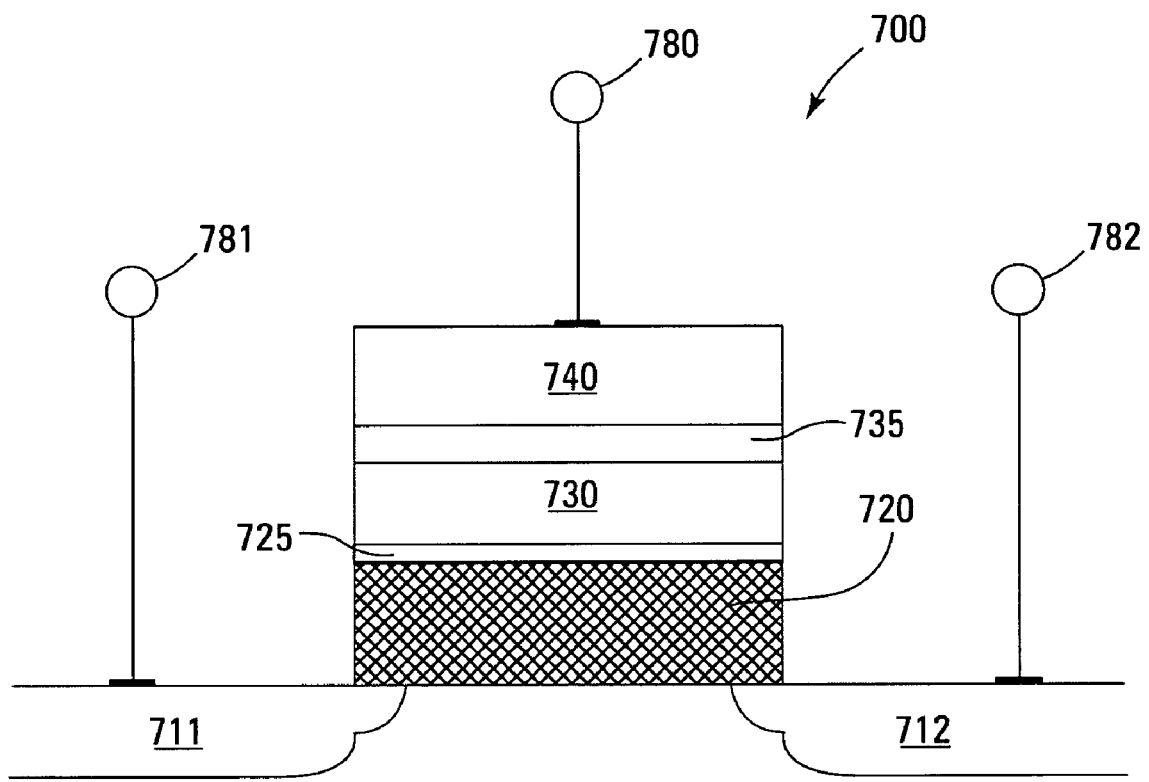
FIG. 7 is a schematic of a memory cell in accordance with an embodiment of the invention for use in describing programming of such memory cells.

FIG. 7 is a schematic of a floating-gate memory cell 700 in accordance with an embodiment of the invention for use in describing programming of such memory cells. For one embodiment, a field is created across the carbon nanotubes 720 by applying a first potential to the control gate 740 through node 780 and applying a second potential to the semiconductor substrate 705. For accumulation of negative charge in the floating gate 730, the second potential is lower than the first potential.

While the second potential could be applied by biasing the semiconductor substrate 705, the second potential could further or alternatively be applied to one or both source/drain regions 711 and 712 through nodes 781 and 782, respectively. In this manner, a field will be generated from the control gate 740 to the substrate 705, passing through the intergate dielectric 735, floating gate 730, tunnel dielectric 725 and carbon nanotubes 720. The potential difference between the first and second potentials is sufficient to generate a field across the carbon nanotubes capable of injecting charge carriers from the substrate 705, including the source/drain regions 711 and 712, into and through the tunnel dielectric 725 for storage in the floating gate 730. In response to the field generated between the first potential and the second potential, electrons from the substrate 705 accumulate in the channel region between the first and second source/drain regions 711 and 712, and enter the carbon nanotubes 720. For one embodiment, the first potential is approximately 5V and the second potential is a ground potential. Other potentials can be used to create appropriate and equivalent fields across the carbon nanotubes 720.

For a further embodiment, the charge carriers are accelerated prior to entering the carbon nanotubes 720. For example, the control gate 740 could receive the first potential, e.g., 5V, at node 780 while first source/drain region 711 receives the second potential, e.g., a ground potential, at node 781. The first and second potentials should be sufficient to create an inversion of the channel region between the first and second source/drain regions 711 and 712. A third potential is applied to the second source/drain region 712, with the third potential being higher than the second potential, but less than the first potential, e.g., 1V, to accelerate electrons from the first source/drain region 711 toward the second source/drain region 712 prior to entering the carbon nanotubes 720.

Although the floating-gate memory cell 700 is depicted to have a contiguous block of carbon nanotubes 720 extending between the source/drain regions 711 and 712, the principles of operation described with reference to FIG. 7 are applicable to embodiments where the carbon nanotubes have discontinuities or do not contact the source/drain regions 711 and/or 712.

Reading a memory cell having carbon nanotubes in accordance with the invention may be carried out using a variety of techniques common to floating-gate memory cells. For example, a read potential may be applied to a control gate, i.e., the word line, of a target memory cell. The read potential is sufficient to activate the memory cell when the memory cell is in a first programmed state, e.g., a floating gate having a substantially neutral charge, and insufficient to activate the memory cell when the memory cell is in a second programmed state, e.g., a floating gate having a negative charge. By applying a forward bias to the bit line of the target memory cell while the read potential is applied to its control gate, the programmed state of the memory cell can be determined by a current flow through the memory cell from the bit line.

Reading a memory cell having carbon nanotubes in accordance with the invention may also be performed by differentiating between the bit line capacitance of the cell in a first programmed state, e.g., a floating gate having a substantially neutral charge, and the bit line capacitance of the cell in a second programmed state, e.g., a floating gate having a negative charge. In principle, the sensing can be accomplished by first charging the target bit line to a first potential and a reference bit line to a second, lower potential with the control gate, i.e., the word line, of the target memory cell not selected. The reference bit line and the target bit line are then isolated. A reference bit line preferably has the same configuration as the target bit line. For example, the target bit line and the reference bit line are generally coupled to the same number of memory cells. The reference bit line is generally a bit line in the same memory array as the target bit line, although a dummy bit line can also be used. When used as a reference bit line, no memory cell coupled to the reference bit line is selected.

When the word line of the target memory cell is selected, a memory cell in the first programmed state will cause the target bit line potential to decrease in order to charge the added capacitance, i.e., the target bit line will lose charge to the target memory cell. A target memory cell in the second programmed state will create substantially no additional capacitance and thus will not produce a change in the bit line potential as the charge loss will be substantially zero. The first and second potentials are chosen such that a target memory cell in the first programmed state will pull the bit line to a potential lower than the second potential upon re-coupling the memory cell. Standard sensing techniques can then be used to detect the voltage differential between the target bit line and a reference bit line caused by the charge loss to the target memory cell.

CONCLUSION

Floating-gate memory cells have been described having carbon nanotubes interposed between the substrate and the tunnel dielectric layer. Such memory cells facilitate ballistic injection of charge into the floating gate. The carbon nanotubes may extend across the entire channel region or a portion of the channel region. For some embodiments, the carbon nanotubes may be concentrated near the source/drain regions.

Although specific embodiments have been illustrated and described herein, it will be appreciated by those of ordinary skill in the art that any arrangement that is calculated to achieve the same purpose may be substituted for the specific embodiments shown. Many adaptations of the invention will be apparent to those of ordinary skill in the art. Accordingly, this application is intended to cover any adaptations or variations of the invention. It is manifestly intended that this invention be limited only by the following claims and equivalents thereof.

What is claimed is:

1. A floating-gate memory cell, comprising:
    a tunnel dielectric layer overlying a semiconductor substrate;
    a floating-gate layer overlying the tunnel dielectric layer;
    an intergate dielectric layer overlying the floating-gate layer;
    a control gate layer overlying the intergate dielectric layer;
    carbon nanotubes extending from the semiconductor substrate to the tunnel dielectric layer; and
    source/drain regions formed in the substrate and defining a channel region therebetween;
    wherein the source/drain regions are adjacent the carbon nanotubes; and
    wherein the carbon nanotubes are overlying the channel region.

2. The floating-gate memory cell of claim 1, wherein at least a portion of the carbon nanotubes are in contact with at least one of the source/drain regions.

3. The floating-gate memory cell of claim 1, wherein tips of the carbon nanotubes are filled with a dielectric material.

4. The floating-gate memory cell of claim 1, wherein the carbon nanotubes extend an entire width of the channel region.

5. The floating-gate memory cell of claim 1, wherein the carbon nanotubes are concentrated near the source/drain regions.

6. The floating-gate memory cell of claim 1, wherein the carbon nanotubes include one or more discontinuities.

7. The floating-gate memory cell of claim 6, wherein at least one discontinuity is filled with dielectric material.

8. The floating-gate memory cell of claim 6, wherein at least one discontinuity is intentional.

9. The floating-gate memory cell of claim 6, wherein the tunnel dielectric layer extends into at least one discontinuity.

10. The floating-gate memory cell of claim 9, wherein the tunnel dielectric layer is adjoining the substrate in the at least one discontinuity.

11. The floating-gate memory cell of claim 10, wherein the control gate layer extends into the at least one discontinuity to be adjacent the substrate.

12. The floating-gate memory cell of claim 1, wherein the semiconductor substrate further comprises a seed layer upon which the carbon nanotubes are formed.

13. A floating-gate memory cell, comprising:
    a plurality of carbon nanotubes overlying a semiconductor substrate;
    source/drain regions formed in the substrate adjacent the plurality of carbon nanotubes;
    a tunnel dielectric layer overlying the plurality of carbon nanotubes;
    a floating-gate layer overlying the tunnel dielectric layer;
    an intergate dielectric layer overlying the floating-gate layer; and
    a control gate layer overlying the intergate dielectric layer.

14. The floating-gate memory cell of claim 13, wherein the plurality of carbon nanotubes are formed on a seed layer formed on the semiconductor substrate.

15. The floating-gate memory cell of claim 13, wherein the plurality of carbon nanotubes form at least one contiguous block extending between the source/drain regions.

16. The floating-gate memory cell of claim 15, wherein the plurality of carbon nanotubes form two contiguous blocks extending between the source/drain regions on either edge of the channel region.

17. The floating-gate memory cell of claim 13, wherein the plurality of carbon nanotubes form a plurality of pillars of carbon nanotubes interspersed between the source/drain regions.

18. The floating-gate memory cell of claim 13, wherein the plurality of carbon nanotubes are formed in an interlayer dielectric overlying the semiconductor substrate.

19. The floating-gate memory cell of claim 18, wherein the interlayer dielectric has a thickness of at least about 100 Angstroms.

20. The floating-gate memory cell of claim 19, wherein the interlayer dielectric has a thickness of less than about 500 Angstroms.

21. A memory device, comprising:
    an array of floating-gate memory cells; and
    circuitry for control and/or access of the array of floating-gate memory cells;
    wherein the at least one memory cell of the array of floating-gate memory cells comprises:
        a tunnel dielectric layer overlying a semiconductor substrate;
        a floating-gate layer overlying the tunnel dielectric layer;
        an intergate dielectric layer overlying the floating-gate layer;
        a control gate layer overlying the intergate dielectric layer;
        carbon nanotubes extending from the semiconductor substrate to the tunnel dielectric layer; and
        source/drain regions formed in the substrate and defining a channel region therebetween;
        wherein the source/drain regions are adjacent the carbon nanotubes; and
        wherein the carbon nanotubes are overlying the channel region.

22. The memory device of claim 21, wherein at least a portion of the carbon nanotubes of a memory cell are in contact with at least one of the source/drain regions of that memory cell and wherein tips of the carbon nanotubes of that memory cell are filled with a dielectric material.

23. The memory device of claim 21, wherein the carbon nanotubes of a memory cell extend contiguously across an entire width of the channel region of that memory cell.

24. The memory device of claim 21, wherein the carbon nanotubes of a memory cell are concentrated near the source/drain regions of that memory cell.

25. The memory device of claim 21, wherein the tunnel dielectric layer of a memory cell extends into at least one discontinuity formed in the carbon nanotubes of that memory cell.

26. The memory device of claim 25, wherein the tunnel dielectric layer of that memory cell is adjoining the substrate in the at least one discontinuity.

27. The memory device of claim 26, wherein the control gate layer of that memory cell extends into the at least one discontinuity to be adjacent the substrate.

28. The memory device of claim 21, wherein the semiconductor substrate further comprises a seed layer upon which the carbon nanotubes of a memory cell are formed.

29. A memory device, comprising:
an array of floating-gate memory cells; and
circuitry for control and/or access of the array of floating-gate memory cells;
wherein the at least one memory cell of the array of floating-gate memory cells comprises:
a plurality of carbon nanotubes overlying a semiconductor substrate;
source/drain regions formed in the substrate adjacent the plurality of carbon nanotubes;
a tunnel dielectric layer overlying the plurality of carbon nanotubes;
a floating-gate layer overlying the tunnel dielectric layer;
an intergate dielectric layer overlying the floating-gate layer; and
a control gate layer overlying the intergate dielectric layer.

30. The memory device of claim 29, wherein the plurality of carbon nanotubes of a memory cell are formed on a seed layer formed on the semiconductor substrate.

31. The memory device of claim 29, wherein the plurality of carbon nanotubes of a memory cell form a contiguous block extending between the source/drain regions of that memory cell.

32. A memory device, comprising:
an array of floating-gate memory cells; and
circuitry for control and/or access of the array of floating-gate memory cells;
wherein the at least one memory cell of the array of floating-gate memory cells comprises:
a plurality of carbon nanotubes overlying a semiconductor substrate and comprising at least one discontinuity;
source/drain regions formed in the substrate adjacent the plurality of carbon nanotubes;
a tunnel dielectric layer overlying the plurality of carbon nanotubes and adjoining the semiconductor substrate in the at least one discontinuity;
a floating-gate layer overlying the tunnel dielectric layer and adjacent the semiconductor substrate in the at least one discontinuity;
an intergate dielectric layer overlying the floating-gate layer; and
a control gate layer overlying the intergate dielectric layer.

33. The memory device of claim 32, wherein the plurality of carbon nanotubes of a memory cell are formed on a seed layer formed on the semiconductor substrate.

34. An electronic system, comprising:
a processor; and
a memory device coupled to the processor, wherein the memory device comprises:
an array of floating-gate memory cells, at least one memory cell comprising:
a tunnel dielectric layer overlying a semiconductor substrate;
a floating-gate layer overlying the tunnel dielectric layer;
an intergate dielectric layer overlying the floating-gate layer;
a control gate layer overlying the intergate dielectric layer;
carbon nanotubes extending from the semiconductor substrate to the tunnel dielectric layer; and
source/drain regions formed in the substrate and defining a channel region therebetween;
wherein the source/drain regions are adjacent the carbon nanotubes; and
wherein the carbon nanotubes are overlying the channel region; and
circuitry for control and/or access of the array of floating-gate memory cells.

35. The electronic system of claim 34, wherein the tunnel dielectric layer of a memory cell extends into at least one discontinuity formed in the carbon nanotubes of that memory cell.

36. The electronic system of claim 35, wherein the tunnel dielectric layer of that memory cell is adjoining the substrate in the at least one discontinuity.

37. The electronic system of claim 36, wherein the control gate layer of that memory cell extends into the at least one discontinuity to be adjacent the substrate.

38. An electronic system, comprising:
a processor; and
a memory device coupled to the processor, wherein the memory device comprises:
an array of floating-gate memory cells, at least one memory cell comprising:
a plurality of carbon nanotubes overlying a semiconductor substrate;
source/drain regions formed in the substrate adjacent the plurality of carbon nanotubes;
a tunnel dielectric layer overlying the plurality of carbon nanotubes;
a floating-gate layer overlying the tunnel dielectric layer;
an intergate dielectric layer overlying the floating-gate layer; and
a control gate layer overlying the intergate dielectric layer; and
circuitry for control and/or access of the array of floating-gate memory cells.

39. An electronic system, comprising:
a processor; and
a memory device coupled to the processor, wherein the memory device comprises:
an array of floating-gate memory cells, at least one memory cell comprising:

a plurality of carbon nanotubes overlying a semiconductor substrate and comprising at least one discontinuity;

source/drain regions formed in the substrate adjacent the plurality of carbon nanotubes;

a tunnel dielectric layer overlying the plurality of carbon nanotubes and adjoining the semiconductor substrate in the at least one discontinuity;

a floating-gate layer overlying the tunnel dielectric layer and adjacent the semiconductor substrate in the at least one discontinuity;

an intergate dielectric layer overlying the floating-gate layer; and a control gate layer overlying the intergate dielectric layer.

* * * * *